United States Patent
Kim (10) Patent No.: US 9,985,586 B2
(45) Date of Patent: May 29, 2018

(54) FRONT END CIRCUIT

(71) Applicant: SAMSUNG ELECTRO-MECHANICS CO., LTD., Suwon-si (KR)

(72) Inventor: Sang Hee Kim, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days. days.

(21) Appl. No.: 15/073,897

(22) Filed: Mar. 18, 2016

(65) Prior Publication Data

US 2016/0352289 A1   Dec. 1, 2016

(30) Foreign Application Priority Data

May 29, 2015  (KR) .................. 10-2015-0076251

(51) Int. Cl.
*H03F 1/30* (2006.01)
*H03F 1/22* (2006.01)
*H03F 3/19* (2006.01)
*H04B 1/38* (2015.01)
*H03F 3/193* (2006.01)
*H03F 3/72* (2006.01)

(52) U.S. Cl.
CPC .............. *H03F 1/303* (2013.01); *H03F 1/22* (2013.01); *H03F 3/193* (2013.01); *H03F 3/72* (2013.01); *H04B 1/38* (2013.01); *H03F 2203/7206* (2013.01); *H03F 2203/7233* (2013.01); *H03F 2203/7236* (2013.01); *H03F 2203/7239* (2013.01)

(58) Field of Classification Search
CPC . H03F 1/303; H03F 1/22; H03F 3/193; H03F 3/72; H03F 2203/7206; H03F 2203/7233; H03F 2203/7236; H03F 2203/7239; H04B 1/38
See application file for complete search history.

(56) References Cited

U.S. PATENT DOCUMENTS

| | | | | |
|---|---|---|---|---|
| 5,410,744 A | * | 4/1995 | Rinderle | H03D 7/1425 327/113 |
| 5,909,643 A | * | 6/1999 | Aihara | H03G 1/0088 330/51 |
| 6,111,459 A | | 8/2000 | Nishijima et al. | |

(Continued)

FOREIGN PATENT DOCUMENTS

| | | |
|---|---|---|
| CN | 1154610 A | 7/1997 |
| CN | 101794793 A | 8/2010 |

(Continued)

OTHER PUBLICATIONS

Chinese Office Action dated Mar. 26, 2018 in Chinese Patent Application No. 201610236964.5 (13 pages in English, 9 pages in Chinese).

(Continued)

*Primary Examiner* — Pablo Tran
(74) *Attorney, Agent, or Firm* — NSIP Law (57) ABSTRACT

A front end circuit includes a bypass circuit comprising a first bypass switch and a second bypass switch configured to bypass a signal to a first terminal according to switching operations of the first bypass switch and the second bypass switch; and an amplifier connected in parallel to the bypass circuit and configured to amplify the signal.

11 Claims, 7 Drawing Sheets

(56) References Cited

U.S. PATENT DOCUMENTS

| | | | |
|---|---|---|---|
| 6,667,657 B2 | 12/2003 | Nakatani et al. | |
| 6,696,680 B2 * | 2/2004 | Wada | G06G 7/28 250/214 LS |
| 6,700,439 B2 | 3/2004 | Jackson | |
| 6,960,959 B2 * | 11/2005 | Komatsu | H03F 3/19 330/124 R |
| 7,317,903 B2 * | 1/2008 | Omori | H04W 52/245 455/127.1 |
| 7,385,445 B2 | 6/2008 | Wright | |
| 7,795,979 B2 * | 9/2010 | Ishiguro | H03F 1/26 330/284 |
| 7,800,438 B2 * | 9/2010 | Emdadi | H03F 1/42 330/124 D |
| 7,983,639 B2 | 7/2011 | Choi et al. | |
| 8,036,148 B2 * | 10/2011 | Fukamachi | H04B 1/44 370/282 |
| 8,130,874 B2 * | 3/2012 | Niemi | H03F 1/26 330/151 |
| 8,536,950 B2 | 9/2013 | Nejati et al. | |
| 9,131,442 B2 | 9/2015 | Hwang et al. | |
| 9,160,377 B2 | 10/2015 | Lee et al. | |
| 9,413,320 B1 | 8/2016 | Pinkhasov | |
| 9,473,198 B1 | 10/2016 | Martin | |
| 9,847,804 B2 | 12/2017 | Lee et al. | |
| 2010/0188163 A1 | 7/2010 | Goto et al. | |
| 2012/0049985 A1 | 3/2012 | Kawai et al. | |
| 2013/0078937 A1 | 3/2013 | Leverich | |
| 2013/0210500 A1 * | 8/2013 | Graham | H04W 52/30 455/571 |
| 2014/0256271 A1 | 9/2014 | Kok | |
| 2015/0054587 A1 * | 2/2015 | Yoshizaki | H03F 1/0261 330/296 |
| 2016/0191092 A1 * | 6/2016 | Liao | H04B 1/006 455/307 |
| 2016/0365908 A1 * | 12/2016 | Chang | H04B 7/0602 |

FOREIGN PATENT DOCUMENTS

| | | |
|---|---|---|
| CN | 101944883 A | 1/2011 |
| JP | 9-148852 A | 6/1997 |
| KR | 10-2012-0024446 A | 3/2012 |
| TW | 201438414 A | 10/2014 |

OTHER PUBLICATIONS

United States Office Action dated Apr. 17, 2018 in corresponding U.S. Appl. No. 15/909,067 (14 pages in English).

\* cited by examiner

FRONT END CIRCUIT

CROSS-REFERENCE TO RELATED APPLICATION(S)

This application claims the benefit under 35 U.S.C. § 119(a) of Korean Patent Application No. 10-2015-0076251, filed on May 29, 2015 in the Korean Intellectual Property Office, the entire disclosure of which is incorporated herein by reference for all purposes.

BACKGROUND

1. Field

The following description relates to a front end circuit.

2. Description of Related Art

As wireless communications technology develops, the wireless communications technology is incorporated into various electronic devices. The most general wireless communications technology incorporated with electronic devices is Wi-Fi technology.

In such a Wi-Fi technology, a wireless front end circuit is connected to an antenna to transmit and/or receive a signal and serves to process the received signal by amplifying or bypassing the received signal.

However, since the wireless front end circuit selectively performs at least two functions, that is, reception or bypassing of the received signal, there are problems in that frequency response characteristics are degraded, or input and output return loss increases.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to a general aspect, a front end circuit includes a bypass circuit comprising a first bypass switch and a second bypass switch and configured to bypass a signal to a first terminal according to switching operations of the first bypass switch and the second bypass switch, and an amplifier connected in parallel to the bypass circuit and configured to amplify the signal.

The bypass circuit may further include a reducer connected in series between the first bypass switch and the second bypass switch.

One end of the first bypass switch may be connected to a second terminal, one end of the second bypass switch may be connected to the other end of the first bypass switch and the other end of the second bypass switch may be connected to the first terminal.

The bypass circuit may further include a reducer, wherein one end of the first bypass switch may be connected to a second terminal, one end of the reducer may be connected to the other end of the first bypass switch, the reducer may be configured to reduce the signal, one end of the second bypass switch may be connected to the other end of the reducer, and the other end of the second bypass switch may be connected to the first terminal.

The reducer may include a first resistor, one end of which may be connected to the other end of the first bypass switch and the other end of the first resistor may be connected to the one end of the second bypass switch, a second resistor, one end of which may be connected to the one end of the first resistor and the other end of which may be grounded, and a third resistor, one end of which may be connected to the other end of the first resistor and the other end of which may be grounded.

The first bypass switch and the second bypass switch may be configured to receive the same switching control signal to responsively perform the switching operations.

The first bypass switch and the second bypass switch may be configured to match input and/or output impedance of the bypass circuit to about 50 ohms.

Each of the first bypass switch and the second bypass switch may include a stacked plurality of intercoupled switches.

The amplifier may include a first amplifying switch, one end of which may be connected to a second terminal configured to receive the signal, an amplifying part, one end of which may be connected to the other end of the first amplifying switch, the amplifying part may be configured to amplify the signal, and a second amplifying switch, one end of which may be connected to the other end of the amplifying part and the other end of the second amplifying switch may be connected to the first terminal.

The amplifier may include a first amplifying switch, one end of which may be connected to a second terminal configured to receive the signal; a first amplifying part, a gate terminal of which may be connected to an other end of the first amplifying switch, and a source terminal of the first amplifying part may be grounded, a second amplifying part, a source terminal of which may be connected to a drain terminal of the first amplifying switch, and a drain terminal of the second amplifying part may be connected to the first terminal; and a second amplifying switch, one end of which may be connected to an other end of the second amplifying part and the other end of which may be connected to the first terminal.

The first and second amplifying switches may be configured to match input and/or output impedance of the amplifying part to about 50 ohms.

The front end circuit may further include a transmission and reception switch, one end of which may be connected to a second terminal and the other end of which may be connected to the amplifier and the bypass circuit.

The transmission and reception switch may be configured to maintain an ON state when the front end circuit performs a reception operation.

According to another general aspect, a front end circuit, includes a bypass circuit configured to bypass a signal to a first terminal, and an amplifier connected in parallel to the bypass circuit and configured to amplify the signal, wherein the amplifier includes a first amplifying switch and a second amplifying switch and configured to amplify the signal according to switching operations of the first amplifying switch and the second amplifying switch.

The amplifier may further include an amplifying part configured to amplify the signal, wherein one end of the first amplifying switch may be connected to a second terminal, one end of the amplifying part may be connected to the other end of the first amplifying switch, one end of the second amplifying switch may be connected to the other end of the amplifying part and the other end of the second amplifying switch may be connected to the first terminal.

The amplifier may further include a first amplifying part and a second amplifying part, wherein one end of the first amplifying switch may be connected to a second terminal, a gate terminal of the first amplifying part may be connected to the other end of the first amplifying switch, a source terminal of the first amplifying part may be connected to ground, a source terminal of the second amplifying part may be connected to a drain terminal of the first amplifying part, a drain terminal of the second amplifying part may be connected to the first terminal, one end of the second amplifying switch may be connected to the other end of the second amplifying part, and the other end of the second amplifying switch may be connected to the first terminal.

According to another general aspect, a method of controlling a front end circuit includes identifying a signal strength of a signal, and, responsive to the identified signal strength, selectively adapting an impedance by selective engagement of a plurality of switches, and, actuating an amplifier to amplify the signal, or, actuating a bypass circuit to omit amplification of the signal.

The method may further include: receiving the signal from an antenna, and, executing a controller coupled to the amplifier and the bypass circuit to identify the signal strength of the signal, and, selectively route the signal to the bypass circuit or the amplifier for output to an output port.

The method may further include receiving the signal from a controller, and, executing the controller coupled to the amplifier and the bypass circuit to identify the signal strength of the signal, and, selectively route the signal to the bypass circuit or the amplifier for output to an antenna for wireless transmission to a wireless receiver.

The plurality of switches may be substantially simultaneously actuated responsive to a common switching signal generated by the controller.

Other features and aspects will be apparent from the following detailed description, the drawings, and the claims.

BRIEF DESCRIPTION OF THE DRAWINGS

The above and other aspects, features, and advantages will be more clearly understood from the following detailed description taken in conjunction with the accompanying drawings, in which.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer, or section from another region, layer, or section. Thus, a first member, component, region, layer, or section discussed below could be termed a second member, component, region, layer, or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments will be described with reference to schematic views illustrating embodiments. In the drawings, for example, due to manufacturing techniques and/or tolerances, modifications of the shape shown may be encountered. Thus, embodiments should not be construed as being limited to the particular shapes of regions shown herein, but should be construed, for example, to include a change in shape resulting from manufacturing. The following embodiments may also be constituted by one or a combination thereof.

Figure 1:
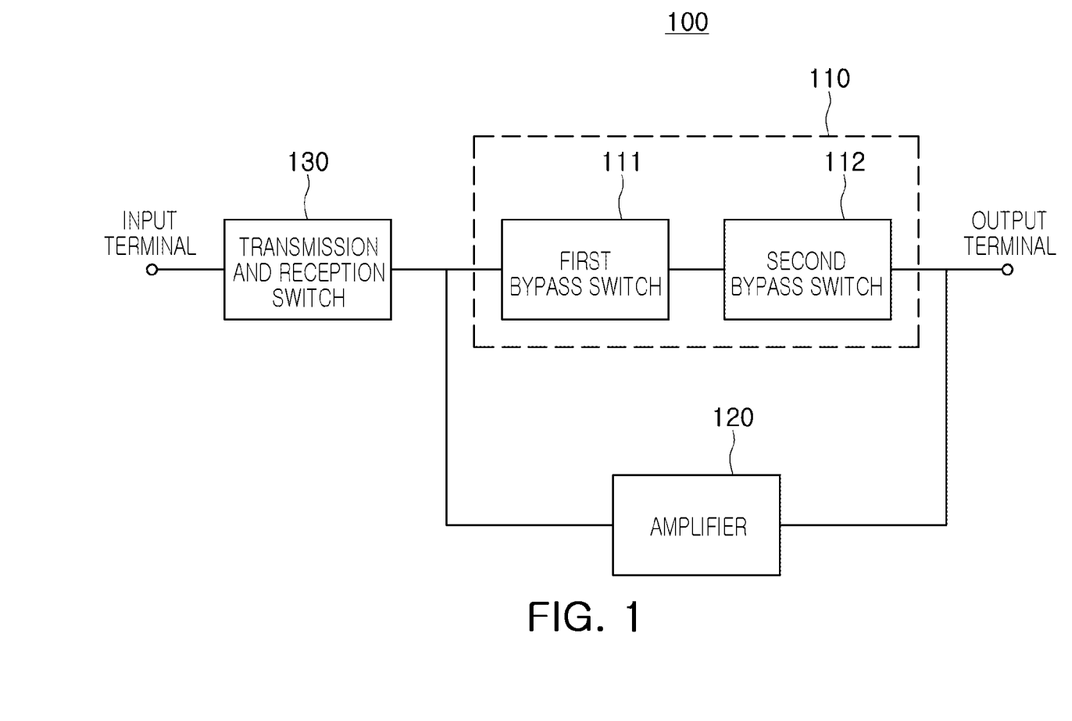
FIG. 1 is a configuration diagram illustrating a front end circuit according to an embodiment.

FIG. 1 is a configuration diagram illustrating a front end circuit according to an embodiment.

Referring to FIG. 1, a front end circuit 100 includes a bypass circuit 110 and an amplifier 120. In some embodiments, the front end circuit 100 further includes a transmission and reception switch 130.

The bypass circuit 110 and the amplifier 120 are connected to each other in parallel between an input terminal and an output terminal.

The input terminal may be connected to an antenna, and the output terminal may be connected to a predetermined control circuit, such as a Wi-Fi control integrated circuit (IC) including a controller, processor, or logic. The predetermined control circuit may employ any suitable wired or wireless transmission scheme such as Wi-Fi, Bluetooth(R), Zigbee(R), Near Field Communication (NFC), Ethernet, or the like.

One of the bypass circuit 110 and the amplifier 120 are activated according to a switching control operation of the controller (not shown). For example, when the front end circuit 100 receives a weak signal, the received signal is amplified by the amplifier 120 and provided to the output terminal. Conversely, when the front end circuit 100 receives a strong signal, the received signal is provided to the output terminal via the bypass circuit 110 without being amplified by the amplifier 120. The controller performs the switching control operation on the bypass circuit 110 and the amplifier 120 to provide the received signal to the output terminal via one of the bypass circuit 110 and the amplifier 120.

In some embodiments, the controller includes a part for sensing a strength of the received and/or to-be transmitted signal, to determine which one of the bypass circuit 110 and the amplifier 120 the received signal will pass through, as described above.

The bypass circuit 110 includes first and second bypass switches 111 and 112 connected in series. The bypass circuit 110 bypasses the amplifier 120 to reroute the received signal in substantially direct manner to the output terminal according to switching operations of the first and second bypass switches 111 and 112.

The amplifier 120 is connected in parallel to the bypass circuit 110. The amplifier 120 amplifies the received signal input thereto.

In some embodiments, one end of the first bypass switch 111 is connected to the input terminal. One end of the second bypass switch 112 is connected to the other end of the first bypass switch 111, and the other end of the second bypass switch 112 is connected to the output terminal.

In some embodiments, the first bypass switch 111 and the second bypass switch 112 are configured by stacking a plurality of switches. This will be described later with reference to FIG. 3.

In some embodiments, the first bypass switch 111 and the second bypass switch 112 perform the switching operations by receiving the same switching control signal. For example, the switching control signal input to the first bypass switch 111 and the second bypass switch 112 may be the same.

In some embodiments, the first bypass switch 111 and the second bypass switch 112 match input/output impedance of the bypass circuit 110 to about 50 ohms. In other words, because the bypass circuit 110 includes not one switch but a pair of switches, the bypass circuit 110 may achieve impedance matching. Thereby, the front end circuit 100 according to the embodiment has improved loss characteristics and improved linearity.

One end of the transmission and reception switch 130 is connected to the input terminal, and the other end of the transmission and reception switch 130 is connected to the amplifier 120 and the bypass circuit 110.

In some embodiments, the transmission and reception switch 130 maintains an ON state while the front end circuit 100 performs a reception operation. The transmission and reception switch 130 is changed to an OFF state while the front end circuit 100 performs a transmission operation. In this case, although not illustrated in the drawings for conciseness and clarity, the front end circuit 100 further includes an additional path connected to the antenna and activated during the transmission operation.

Figure 2:
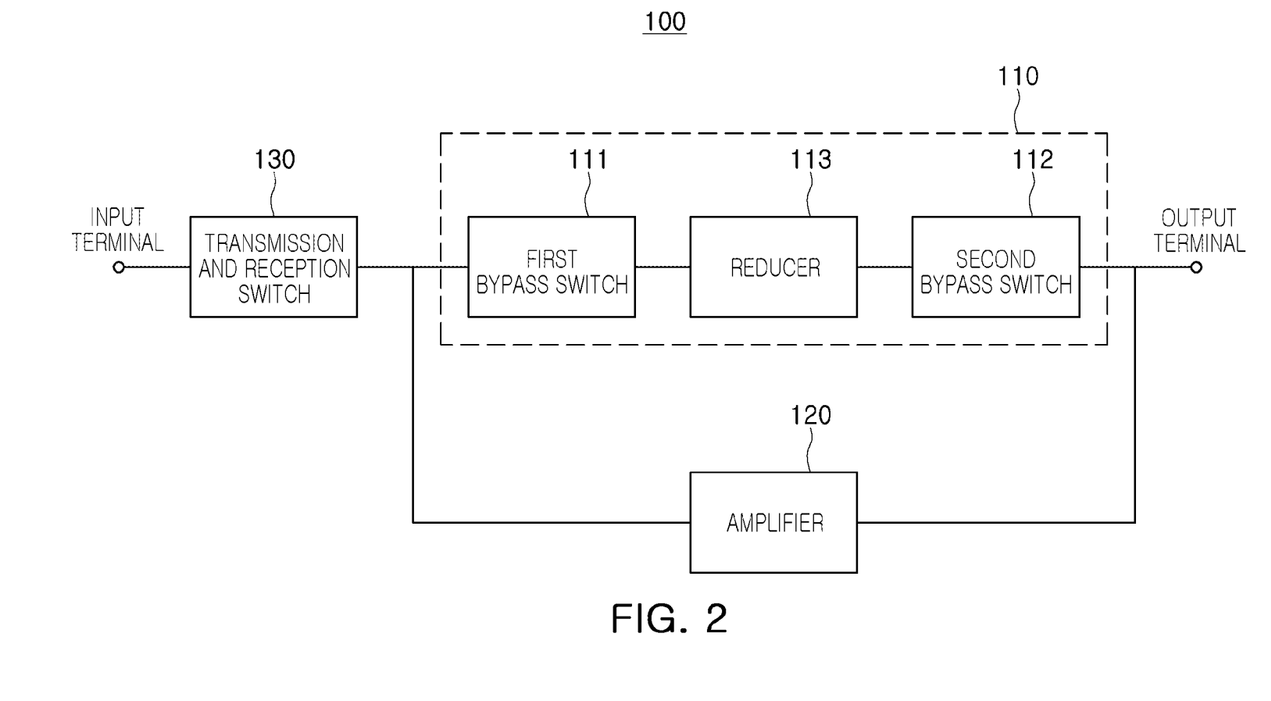
FIG. 2 is a configuration diagram illustrating a front end circuit according to another embodiment.

FIG. 2 is a configuration diagram illustrating a front end circuit according to another embodiment of the present disclosure. According to the embodiment illustrated in FIG. 2, the bypass circuit 110 further includes a reducer 113. Components other than the reducer 113 in the embodiment may be understood from those described with reference to FIG. 1 and will not be repeated herein for clarity and conciseness.

In some embodiments, the bypass circuit 110 includes a first bypass switch 111, one end of which is connected to the input terminal, a reducer 113, one end of which is connected to the other end of the first bypass switch 111, configured to reduce an input signal, and the second bypass switch 112, one end of which is connected to the other end of the reducer 113 and the other end of which is connected to the output terminal.

The reducer 113 is connected in series between the first bypass switch 111 and the second bypass switch 112. The reducer 113 reduces, such as by attenuation, the input signal. Such reduction may be based on signal strength, intensity, or amplitude being above a predetermined threshold or based on other measures.

Since the first bypass switch 111 and the second bypass switch 112 according to the embodiment are designed for matching of input/output impedance, the input signal is reduced using the additional reducer 113. Thus, according to the embodiment, the bypassed input signal maintains loss characteristics having excellent flatness in a broadband range.

Such a reducer 113 according to an embodiment will be described later with reference to FIG. 4.

Figure 3:
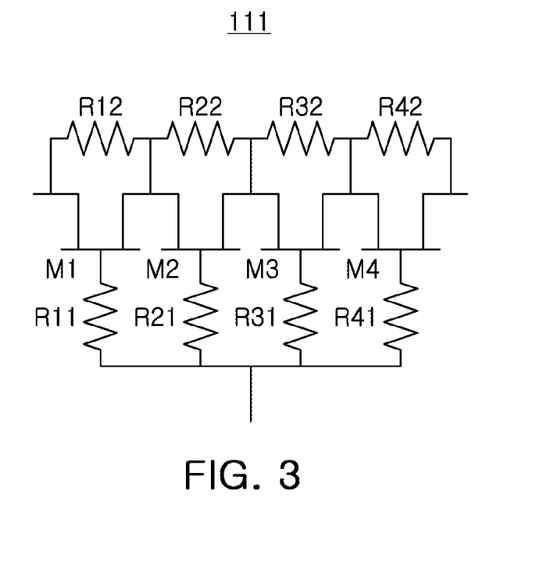
FIG. 3 is a circuit diagram illustrating an embodiment of the bypass illustrated in FIGS. 1 and 2.

FIG. 3 is a circuit diagram illustrating an embodiment of the bypass illustrated in FIGS. 1 and 2.

Referring to FIG. 3, a first bypass switch 111 has a structure in which a plurality of switches M1, M2, M3, and M4 are stacked. The switches may be intercoupled transistors or other suitable electronic components. The plurality of switches M1, M2, M3, and M4 respectively include a plurality of resistors R12, R22, R32, and R42 coupled between sources and drains, receiving switching control signals via gate resistors R11, R21, R31, and R41.

In the first bypass switch 111, the first switch M1 is an input terminal, and the fourth switch M4 is an output terminal. However, since the first bypass switch 111 has a symmetrical structure, the fourth switch M4 may be the input terminal, and the first switch M1 may be the output terminal.

Although FIG. 3 illustrates a structure in which four switches M1, M2, M3, and M4 are stacked, the number of switches is only an example, and may be variously changed according to embodiments.

The first bypass switch 111 and the second bypass switch 112 may have the same structure. The first bypass switch 111 and the second bypass switch 112 may have the same structure and thus may match the input/output impedance to about 50 ohms.

Figure 4:
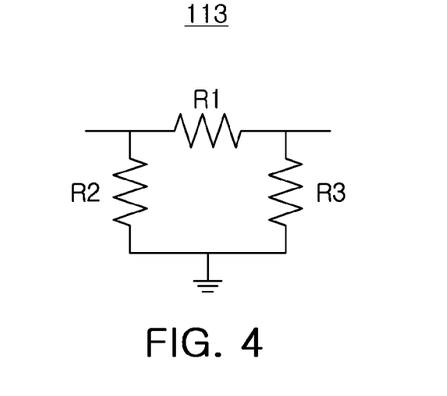
FIG. 4 is a circuit diagram illustrating an embodiment of the reducer illustrated in FIGS. 1 and 2.

FIG. 4 is a circuit diagram illustrating an embodiment of the reducer illustrated in FIGS. 1 and 2.

The reducer 113 includes a first resistor R1, and second and third resistors R2 and R3 connected to both ends of the first resistor R1.

One end of the first resistor R1 is connected to the other end of the first bypass switch 111, and the other end of the first resistor R1 is connected to the one end of the second bypass switch 112. The resistance value of the first resistor R1 may be determined depending on a reduction ratio of an input signal.

One end of the second resistor R2 is connected to the one end of the first resistor R1, and the other end of the second resistor R2 is grounded. One end of the third resistor R3 is connected to the other end of the first resistor R1, and the other end of the third resistor R3 is grounded.

Although FIG. 4 illustrates a pi-type reducer circuit or attenuator circuit, according to embodiments, the reducer 113 may have a variety of structures such as a T-type structure. Any suitable attenuator or reducer structure such as a voltage divider network comprising intercoupled fixed resistors or variable potentiometers may be employed.

Figure 5:
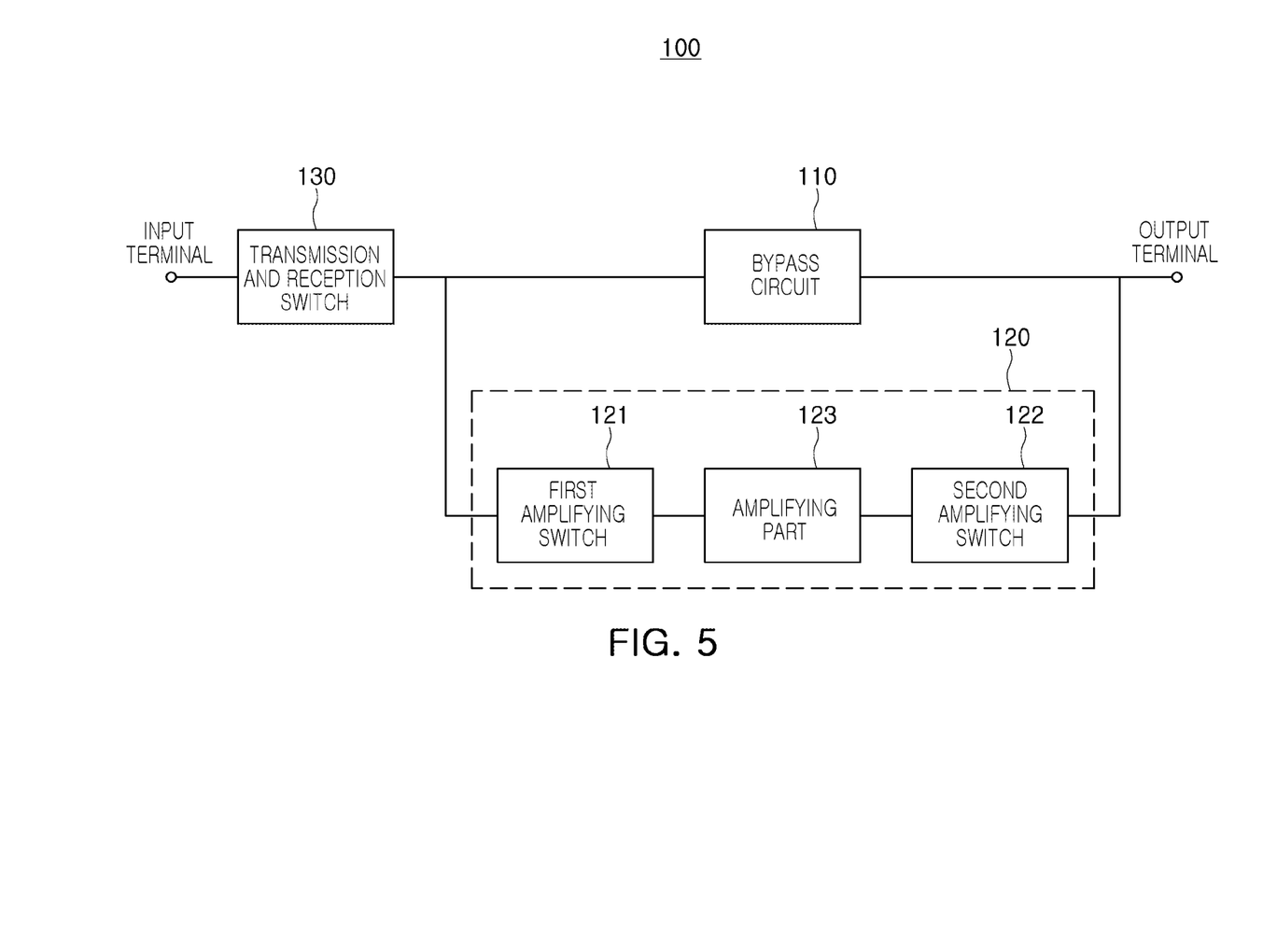
FIG. 5 is a configuration diagram illustrating a front end circuit according to still another embodiment.

FIG. 5 is a configuration diagram illustrating a front end circuit according to another embodiment. FIG. 5 illustrates another embodiment of an amplifier 120. Components other than the amplifier 120 in the embodiment may be understood from those described with reference to FIGS. 1 to 4 and will not be repeated here for clarity and conciseness.

Referring to FIG. 5, the amplifier 120 includes a first amplifying switch 121, an amplifying part 123, and a second amplifying switch 122.

The amplifier 120 amplifies a received signal according to switching operations of the first and second amplifying switches 121 and 122.

One end of the first amplifying switch 121 is connected to an input terminal. One end of the amplifying part 123 is connected to the other end of the first amplifying switch 121, and amplifies the received signal. One end of the second amplifying switch 122 is connected to the other end of the amplifying part 123, and the other end of the second amplifying switch 122 is connected to the output terminal.

In some embodiments, the first and second amplifying switches 121 and 122 have a structure in which a plurality of switches are stacked. For example, the first and second amplifying switches 121 and 122 have the structure illustrated in FIG. 3.

In some embodiments, the first and second amplifying switches 121 and 122 match input/output impedance of the amplifier 120 to about 50 ohms. This may be understood by the descriptions on the first bypass switch 111 and the second amplifying switch 122 described above with reference to FIGS. 1 to 3.

Figure 6:
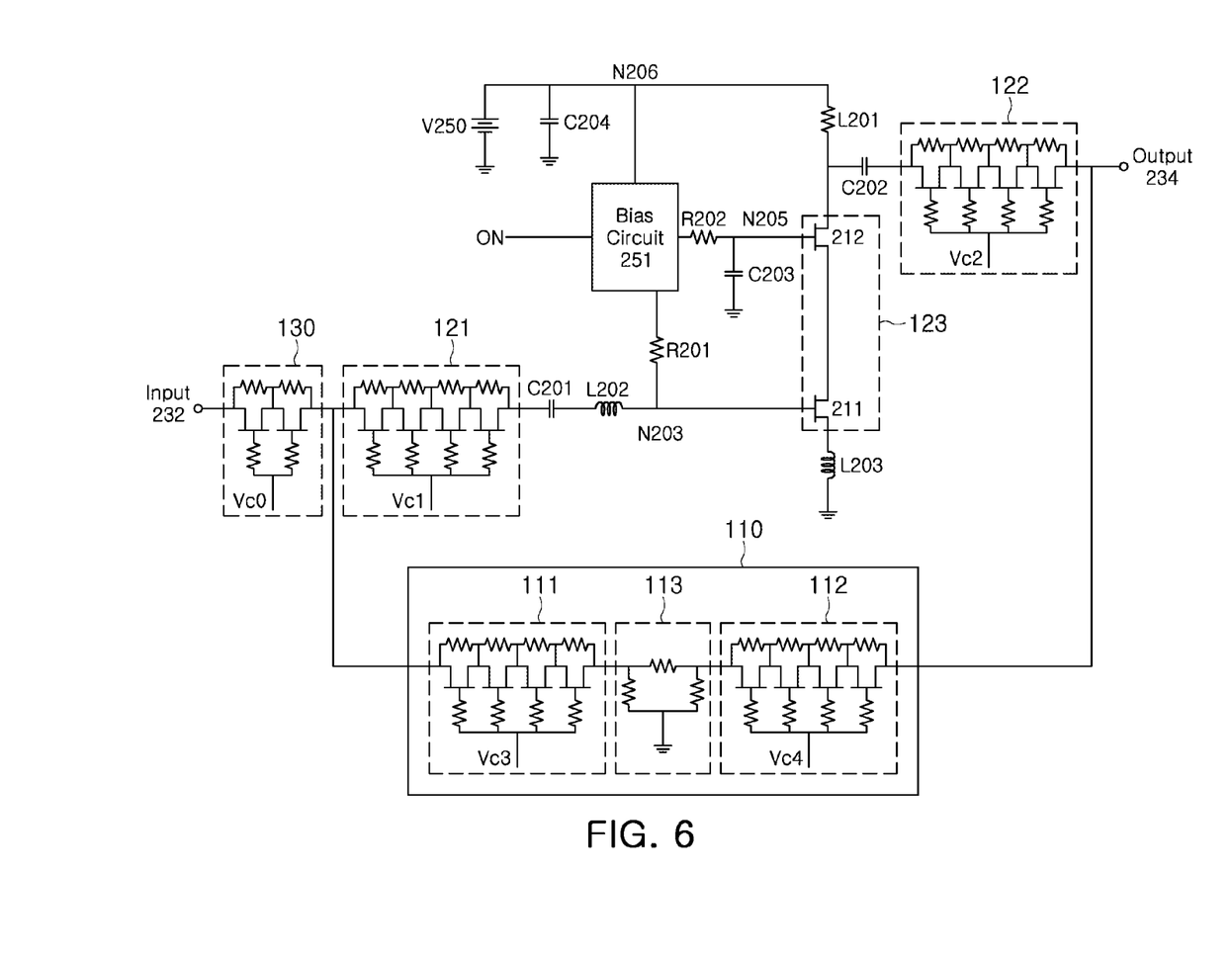
FIG. 6 is a circuit diagram illustrating a front end circuit according to still another embodiment.

FIG. 6 is a circuit diagram illustrating a front end circuit according to another embodiment.

Referring to FIG. 6, an input terminal 232 is connected to an input/output switch 130.

Two parallel paths are connected between the input/output switch 130 and an output terminal 234. One is a bypassing path by a bypass circuit 110, and the other is an amplifying path by amplifiers 121, 123, and 122.

The amplifiers 121, 123, and 122 include a first amplifying switch 121, a first amplifying part 211, a second amplifying part 212, and a second amplifying switch 122. One end of the first amplifying switch 121 is connected to an input terminal 232. A gate terminal of the first amplifying part 211 is connected to the other end of the first amplifying switch 121, and a source terminal of the first amplifying part 211 is grounded. A source terminal of the second amplifying part 212 is connected to a drain terminal of the first amplifying part 211, and a drain terminal of the second amplifying part 212 is connected to the output terminal 234. One end of the second amplifying switch 122 is connected to the other end of the second amplifying part 212, and the other end of the second amplifying part 212 is connected to the output terminal 234.

Figure 7:
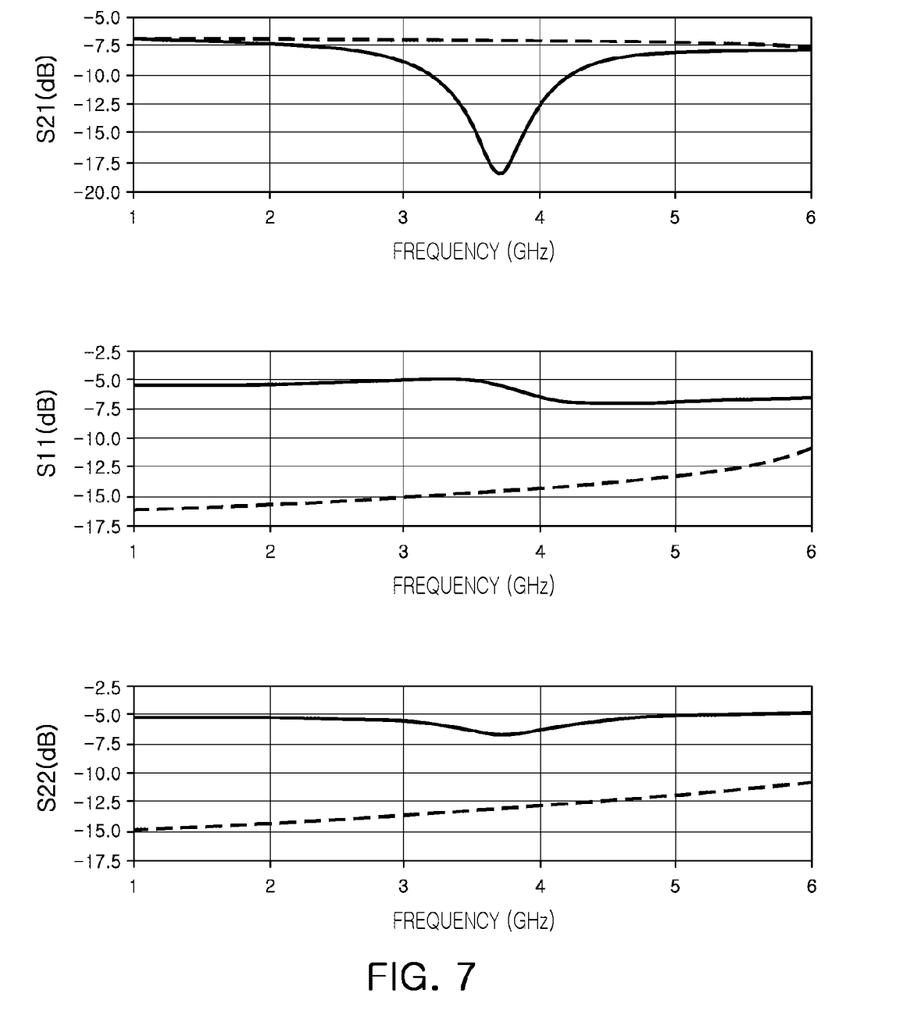
FIG. 7 are graphs illustrating loss characteristics of a front end circuit according to an embodiment.

FIG. 7 includes graphs illustrating loss characteristics of a front end circuit according to an embodiment.

FIG. 7 illustrates loss characteristics (S21), input return loss characteristics (S11), and output return loss characteristics (S22) of a front end circuit according to an embodiment and an existing front end circuit. In the graphs, solid lines represent the front end circuit according to the embodiment, and dotted lines represent the existing front end circuit, which does not employ a pair of switches according to the embodiment.

As illustrated in FIG. 7, the front end circuit according to the embodiment has a loss of about −7.0 dB at 2.4 GHz and exhibits broadband characteristics and excellent loss flatness, compared to the existing front end circuit. In S11 illustrating the input return loss, the return loss of the front end circuit according to the embodiment is about −15.4 dB at 2.4 GHz, which is a significantly reduced value compared to about −5.4 dB of the existing front end circuit. In S22 illustrating the output return loss, the output loss of the front end circuit according to the embodiment is about −14.1 dB at 2.4 GHz, which is also a significantly reduced value compared to about −5.5 dB of the existing front end circuit.

Figure 8:
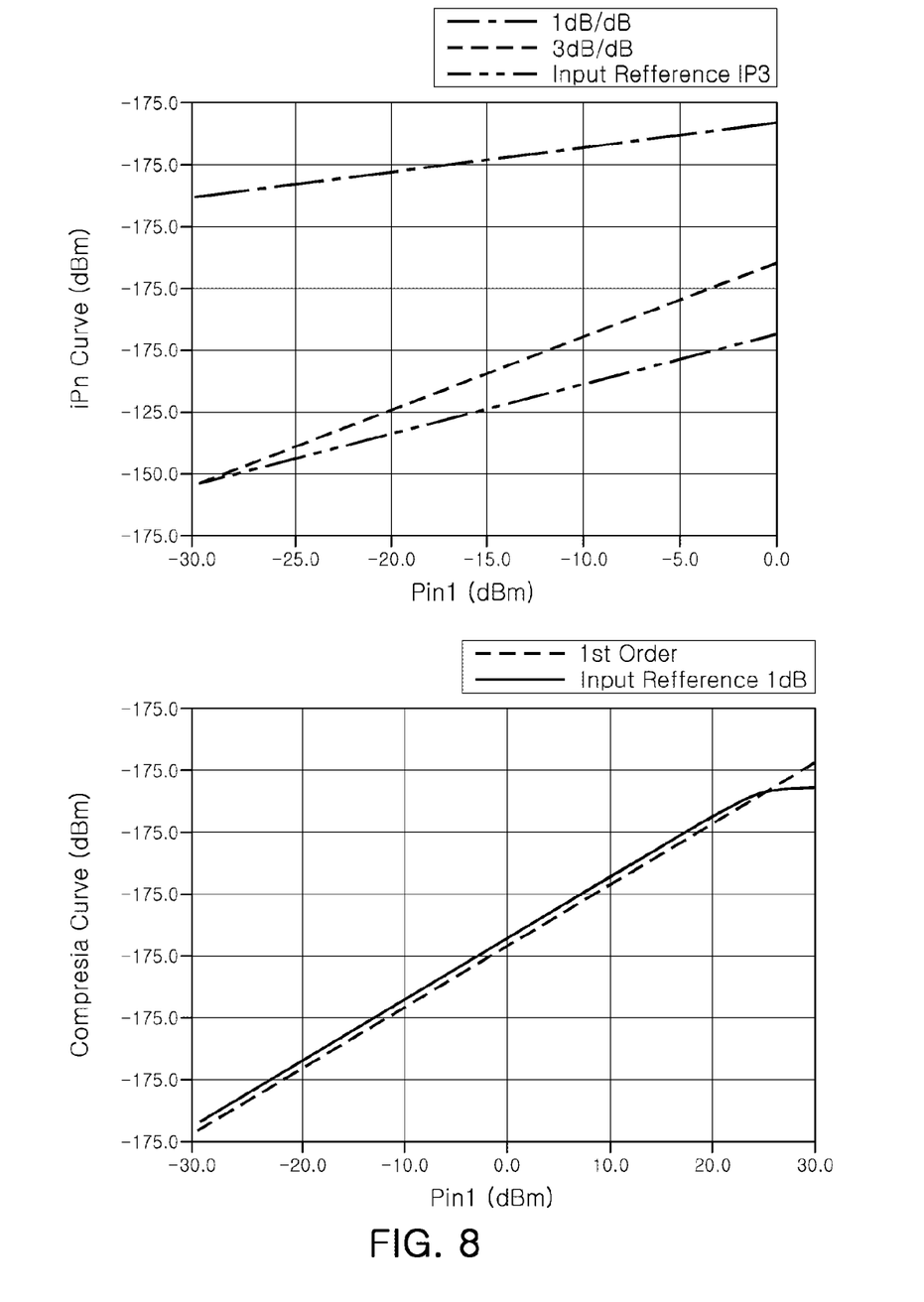
FIG. 8 are graphs illustrating linearity of a front end circuit according to an embodiment.

FIG. 8 are graphs illustrating linearity of a front end circuit according to an embodiment.

FIG. 8 illustrates linearity performance of the front end circuit in the $3^{rd}$-order input intercept point (IIP3), or the 1 dB gain compression point (P1dB). An IIP3 value of the front end circuit according to the embodiment is about 28.4 dBm, which is a significantly improved value compared to about 7.4 dBm of the existing front end circuit. In addition, a P1dB value of the front end circuit according to the embodiment is about 24.5 dBm, which is also a significantly improved value compared to about −2.5 dBm of the existing front end circuit.

The apparatuses, units, parts, modules, devices, control circuit, and other components that perform the operations described herein are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result.

In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The operations described herein may be performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure. As set forth above, according to embodiments of the present disclosure, impedance matching and linearity of a front end circuit may be improved.

What is claimed is:

1. A front end circuit, comprising:
a bypass circuit comprising a first bypass switch and a second bypass switch configured to bypass a signal to an output terminal according to switching operations of the first bypass switch and the second bypass switch, comprising a reducer configured to reduce the signal, the reducer comprising
a first resistor, a first end of which is connected to a second end of the first bypass switch and a second end of which is connected to a first end of the second bypass switch,
a second resistor, a first end of which is connected to the first end of the first resistor and a second end of which is grounded, and
a third resistor, a first end of which is connected to the second end of the first resistor and a second end of which is grounded; and
an amplifier connected in parallel to the bypass circuit and configured to amplify the signal.

2. The front end circuit of claim 1, wherein a first end of the first bypass switch is connected to an input terminal, a first end of the reducer is connected to the second end of the first bypass switch, the first end of the second bypass switch is connected to a second end of the reducer, and a second end of the second bypass switch is connected to the output terminal.

3. The front end circuit of claim 1, wherein the first bypass switch and the second bypass switch are configured to receive a same switching control signal to perform the switching operations.

4. The front end circuit of claim 1, wherein the first bypass switch and the second bypass switch are configured to match either one or both of input impedance and output impedance of the bypass circuit to about 50 ohms.

5. The front end circuit of claim 4, wherein each of the first bypass switch and the second bypass switch comprises stacked intercoupled switches.

6. The front end circuit of claim 1, wherein the amplifier comprises:
- a first amplifying switch, a first end of which is connected to an input terminal configured to receive the signal;
- an amplifying part, a first end of which is connected to a second end of the first amplifying switch, the amplifying part being configured to amplify the signal; and
- a second amplifying switch, a first end of which is connected to a second end of the amplifying part, a second end of the second amplifying switch being connected to the output terminal.

7. The front end circuit of claim 1, wherein the amplifier comprises:
- a first amplifying switch, a first end of which is connected to an input terminal configured to receive the signal;
- a first amplifying part, a gate terminal of which is connected to a second end of the first amplifying switch, a source terminal of the first amplifying part being grounded;
- a second amplifying part, a source terminal of which is connected to a drain terminal of the first amplifying switch, a drain terminal of the second amplifying part being connected to the output terminal; and
- a second amplifying switch, a first end of which is connected to a second end of the second amplifying part and a second end of which is connected to the output terminal.

8. The front end circuit of claim 6, wherein the first and second amplifying switches are configured to match either one or both of input impedance and output impedance of the amplifying part to about 50 ohms.

9. The front end circuit of claim 1, further comprising a transmission and reception switch, a first end of which is connected to an input terminal and a second end of which is connected to the amplifier and the bypass circuit.

10. The front end circuit of claim 9, wherein the transmission and reception switch is configured to maintain an ON state in response to the front end circuit performing a reception operation.

11. A front end circuit, comprising:
- a bypass circuit configured to bypass a signal to an output terminal; and
- an amplifier connected in parallel to the bypass circuit and configured to amplify the signal,
- wherein the amplifier comprises
  - a first amplifying switch, a first end of which is connected to an input terminal configured to receive the signal,
  - a first amplifying part, a gate terminal of which is connected to a second end of the first amplifying switch, a source terminal of the first amplifying part being grounded,
  - a second amplifying part, a source terminal of which is connected to a drain terminal of the first amplifying switch, a drain terminal of the second amplifying part being connected to the output terminal, and
  - a second amplifying switch, a first end of which is connected to a second end of the second amplifying part and a second end of which is connected to the output terminal.

* * * * *